United States Patent
Frosien et al.

(10) Patent No.: US 7,439,500 B2
(45) Date of Patent: Oct. 21, 2008

(54) ANALYZING SYSTEM AND CHARGED PARTICLE BEAM DEVICE

(75) Inventors: Juergen Frosien, Riemerling (DE); Stefan Lanio, Erding (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 246 days.

(21) Appl. No.: 11/384,044

(22) Filed: Mar. 17, 2006

(65) Prior Publication Data

US 2006/0226361 A1    Oct. 12, 2006

(30) Foreign Application Priority Data

Mar. 17, 2005   (EP)   ................... 05005886

(51) Int. Cl.
*H01J 37/244* (2006.01)
*H01J 37/05* (2006.01)
*H01J 49/48* (2006.01)
*G01R 31/305* (2006.01)

(52) U.S. Cl. .............. 250/305; 250/307; 250/310; 250/397

(58) Field of Classification Search ............ 250/305, 250/307, 310, 397
See application file for complete search history.

(56) References Cited

U.S. PATENT DOCUMENTS

| | | | |
|---|---|---|---|
| 3,474,245 A * | 10/1969 | Kimura et al. ............. 250/310 |
| 4,658,137 A * | 4/1987 | Garth et al. ............... 250/310 |
| 4,882,486 A * | 11/1989 | Kruit ....................... 250/305 |
| 4,896,036 A * | 1/1990 | Rose et al. ................. 250/310 |
| 5,008,537 A * | 4/1991 | Toita et al. ................. 250/309 |
| 5,146,090 A * | 9/1992 | Plies ....................... 250/310 |
| 5,191,213 A * | 3/1993 | Ahmed et al. .............. 250/310 |
| 5,644,132 A * | 7/1997 | Litman et al. .............. 250/310 |
| 5,894,124 A | 4/1999 | Iwabuchi et al. |
| 6,043,491 A * | 3/2000 | Ose et al. .................. 250/310 |
| 6,476,390 B1 | 11/2002 | Murakoshi et al. |
| 6,888,150 B2 * | 5/2005 | Harnack et al. ........... 250/492.2 |

FOREIGN PATENT DOCUMENTS

| | | |
|---|---|---|
| DE | 3941178 A1 | 6/1991 |
| DE | 19953300 A1 | 5/2000 |
| EP | 0872873 A2 | 10/1998 |
| JP | 2001357808 | 12/2001 |
| WO | 9608835 A1 | 3/1996 |

OTHER PUBLICATIONS

European Search Report dated Jan. 31, 2006.

* cited by examiner

*Primary Examiner*—Jack I Berman
(74) *Attorney, Agent, or Firm*—Patterson & Sheridan, LLP

(57) ABSTRACT

The present invention relates to an analyzing system with improved detection scheme and a charged particle beam device comprising the same. The analyzing system for analyzing a beam of charged particles has a divider to divide the beam of charged particles according to their energies into a low energy beam and a high energy beam; a front detector for detecting the high energy beam; and at least one reverse detector for detecting the low energy beam. The divider is positioned between the front detector and the at least one reverse detector and the front detector and/or the at least one reverse detector are segmented.

27 Claims, 12 Drawing Sheets

ANALYZING SYSTEM AND CHARGED PARTICLE BEAM DEVICE

FIELD OF THE INVENTION

The invention relates to an analyzing system for analyzing a beam of charged particles and a charged particle beam device. More specifically, the invention relates to a charged particle beam device for inspecting a specimen by said analyzing system. It also relates to a method of inspecting a specimen.

BACKGROUND OF THE INVENTION

Charged particle beam devices are often used to inspect a specimen by detecting secondary charged particles that are generated by a primary charged particle beam interacting with the specimen. If the primary charged particle beam generated by the charged particle beam device is an electron beam, interaction with a specimen typically generates (a) secondary electrons, (b) reflected or backscattered electrons, (c) Auger electrons, (d) transmitted electrons, (e) X-radiation, (f) cathodoluminescence radiation, and/or (g) absorbed (specimen) current.

In many applications, only the secondary electrons, backscattered electrons and Auger electrons are analyzed in order to inspect a specimen. Secondary electrons result from inelastic collisions of the primary electrons with the outer electrons of specimen atoms. As a consequence, the electrons have enough energy to leave the respective shell. Their kinetic energy is in general low. Hence, only electrons close to the specimen surface can escape from the specimen. This is why the analysis of secondary electrons is well suited for specimen surface inspections.

Reflected or backscattered electrons are electrons of the primary beam that have been deflected by collisions with specimen atoms. Their typical energy range extends from the full primary electron energy down to the level of secondary electron energies. Backscattered electrons with a high energy can also be used to inspect a specimen deeper below the surface.

Auger electrons have an energy that is characteristic for the material of the specimen which facilitates an analysis of the material structure of the specimen.

For the following discussion, there is no need to further distinguish between secondary electrons, backscattered electrons and Auger electrons. Therefore, these three types will, for simplicity, be referred to as "secondary electrons".

Secondary electrons that succeed in leaving the specimen carry information of the specimen by means of their rate of occurrence, by their directions and by their energies. In order to evaluate the information of the secondary beam, a detector for measuring the current of secondary electrons is used. This is shown in FIG. 1, where primary beam 1 generated by source 5 is directed onto specimen 7. The secondary electrons 2 that succeed in leaving the specimen are subsequently detected by detector 6.

For measuring the energy of the secondary electrons, several techniques are known in the art. One technique is described in "Electrical testing for failure analysis: E-beam Testing" by Michel Vallet and Philippe Sardin (Microeletronic Engineering 49 (1999), p. 157-167). Therein, an energy filter grid is arranged between the electron source and the specimen. The energy filter is biased with a small voltage to create a retarding electric field due to which all secondary electrons whose energy is less than a threshold energy will be deflected. Those electrons with higher energy will pass the grid to become detected by a detector.

However, the set-up of M. Vallet and P. Sardin is limited in that it is only a high-pass filter, that is, only electrons with a high energy will pass through the grid arrangement and will be detected. Furthermore, the electric field of the retarding field grid tends to interfere with the primary electron beam 1 in undesirable ways.

Furthermore, another aspect of measuring the secondary electrons should be emphasized: if secondary electrons are analyzed within the framework of object inspection, e.g. wafer inspection, the throughput depends mainly on the four following factors: defect size D, image contrast C, beam current density J and number of columns N working in parallel. As the throughput is proportional to the square of the image contrast C, the image contrast is a very essential factor for improving the inspection throughput.

There are basically three types of contrast: one contrast depending on the secondary charged particles energy, another on the starting angle of the secondary electrons with respect to the incoming beam of primary charged particles and the third on the azimuth starting angle of the secondary electrons. Improvement of each type of contrast will quadratically improve the throughput of an inspection device. A high throughput is indispensable in commercial applications in order to provide for a surface inspection at competitive costs.

It is accordingly an object of the present invention to provide an analyzing system and a charged particle beam device which overcome at least some of the disadvantages known in the art.

SUMMARY OF THE INVENTION

One aspect of embodiments of the present invention provides an analyzing system comprising a divider adapted to divide a beam of charged particles into a low energy beam and a high energy beam, a front detector for detecting the high-energy beam, and at least one reverse detector for detecting the low energy beam, wherein the divider is positioned between the front detector and the at least one reverse detector, and wherein the front detector and/or the at least one reverse detector are segmented.

Another aspect of embodiments of the present invention provides a charged particle beam device for inspecting a specimen, comprising a charged particle beam source for directing a beam of primary charged particles onto the specimen to generate a beam of secondary, scattered and/or backscattered charged particles, an analyzing system, comprising: a divider adapted to divide a beam of charged particles into a low energy beam and a high energy beam, a front detector for detecting the high energy beam, and at least one reverse detector for detecting the low energy beam, wherein the divider is positioned between the front detector and the at least one reverse detector, wherein the front detector and/or the at least one reverse detector are segmented, and wherein the beam of charged particles is the beam of secondary scattered and/or backscattered charged particles.

Another aspect of embodiments of the present invention includes at least two charged particle beam devices.

Another aspect of embodiments of the present invention provides a method for inspecting a specimen comprising the steps of dividing a beam of secondary, scattered and/or backscattered charged particles into a beam of high energy particles and a beam of low energy particles, detecting particles of the beam of high energy particles at a front detector, detecting particles of the beam of low energy particles at a reverse detector, wherein dividing is carried out at a position between the front detector and the reverse detector, and wherein detecting the high energy particles and/or detecting the low energy particles comprises angle sensitive detection.

The application of the invention allows for the analysis of a charged particle beam in an improved and comprehensive way.

Further advantages, features, aspects and details of the invention are evident from the dependent claims, the description and the accompanying drawings.

According to one aspect of the present invention, the analyzing system comprises the following components:
- a divider to divide the beam of charged particles according to their energies into a low energy beam and a high energy beam;
- a front detector for detecting the high energy beam; and
- at least one reverse detector for detecting the low energy beam,
- wherein the divider is positioned between the at least one reverse detector and the front detector; and
- wherein the at least one reverse detector and/or the front detector is segmented to provide a spatial resolution of the particles from the incoming beam of charged particles.

According to aspects of the present invention, the position of the at least one reverse detector is upstream of the divider, wherein upstream is to be understood with respect to the beam of the charged particles, i.e., a charged particle firstly passes an upstream position, i.e., the reverse detector, and later on its flight a downstream position, i.e., the detector. Thus, from the viewpoint of a charged particle being analyzed, the reverse detector is prior to the divider. According to an aspect of the invention, the divider acts as an energy filter.

The analyzing system according to the invention allows for the detection and analysis of particles with arbitrary energy. Moreover, due to the segmented detector(s), the analyzing system allows for the distinction of charged particles depending on their starting angle. Thus, by segmenting at least one detector, further to the energy resolution, the particles from the incoming beam are detected with respect to their impinging position on the detector. This, in turn, allows conclusions to be drawn concerning their travelling direction when entering the analyzing system. Energy and position sensitive detection is especially useful when used in a charged particle beam device, as it provides for contrast enhancement.

The present invention provides an analyzing system and a charged particle beam device capable of reading out information about the charged particle's energies and their starting angles. The throughput of the analyzing system and/or the charged particle device is increased by enhancing the contrast.

In one embodiment of the analyzing system according to the present invention, the at least one reverse detector is positioned and shaped in such a way that it allows the beam of charged particles to pass through it on its way to the divider. For instance, the at least one reverse detector may have a hole in the middle.

In one embodiment, the front detector and/or the at least one reverse detector are segmented in azimuth segments to provide for a spatial resolution of the particles from the incoming beam of charged particles with respect to the azimuth angle. In another embodiment, the front detector and/or reverse detector are segmented in concentric detection segments, which are typically circularly disposed, to provide for a spatial resolution of the particles from the incoming beam of charged particles with respect to the radial direction. In another embodiment, the front detector and/or reverse detector are segmented in both azimuth and concentric detection segments.

Typically, a high bandwidth diode is used as detector, e.g. a pin diode. It will be clear for a person skilled in the art that other detectors such as scintillation detectors or channel detectors are also applicable.

Since the starting conditions of the secondary electrons depend on the local surface topography and the secondary electron landing point on the detector also depends on the azimuthal orientation of the starting velocity, information can be derived if the detector surface is segmented. This is especially useful for the outer zones of the detector. This has the additional advantage of further improving the detection bandwidth in the case of the pin diodes.

In a typical embodiment of the analyzing system according to the present invention, the at least one reverse detector are two reverse detectors.

According to another aspect of the present invention, a charged particle beam device for inspecting a specimen is provided comprising:
- a charged particle beam source for directing a beam of primary charged particles onto the specimen to generate a beam of secondary charged particles; and
- an analyzing system as described herein, wherein the beam of charged particles is the beam of secondary charged particles.

That is, if the analyzing system as described in detail above is employed in a charged particle beam device, the incoming beam of charged particles to be analyzed is the beam of secondary charged particles generated on the specimen. Thus, using the analyzing system in a charged particle beam device, information on the specimen, in particular on the specimen surface, can be read out and evaluated. This evaluation especially includes the advantage that particles of all energies can be detected, i.e. there is no energy threshold below or above which the particles are ignored.

According to one embodiment, the charged particle beam device comprises a bending sector which is capable of deflecting the beam of secondary charged particles. Typically, the bending sector is capable of deflecting the beam of secondary charged particles in a direction essentially perpendicular to the propagation direction of the beam of primary charged particles. In another embodiment, the bending sector acts additionally as a lens unit. In one embodiment of the present invention, the bending sector is positioned upstream of the at least one reverse detector with respect to the beam of the secondary charged particles. That is, in this embodiment, the bending sector is disposed between specimen and reverse detector.

In yet another embodiment, the charged particle beam device according to the present invention comprises at least one electrostatic, magnetic or compound electrostatic-magnetic lens assembly, e.g. an Einzellens or an immersion lens, positioned between the bending sector exit and the divider for focusing the beam of secondary charged particles. In one embodiment, at least one reverse detector is positioned within the lens unit and at least one reverse detector is positioned between the bending sector exit and the lens unit. One reverse detector may be mounted to the bending sector exit. The reverse detector positioned within the lens unit may be mounted to the lens unit. The mounting to the bending sector or the lens unit facilitates the set-up of the charged particle beam device. For a person skilled in the art, however, it will be clear that the reverse detectors can be disposed also at other positions between divider and bending sector.

In one embodiment of the present invention, the charged particle beam device comprises a deflector unit, e.g. a magnetic deflector, an electrostatic deflector or a Wien filter for separating the beam of primary charged particles and the beam of secondary charged particles. In one embodiment, the charged particle beam device according to the present invention further comprises an objective lens positioned to have both the primary charged particle beam and the secondary charged particle beam passed through the objective lens. The objective lens allows particularly the focusing of the primary charged particle beam. The objective lens is typically positioned narrowly above the specimen.

In yet another embodiment, the charged particle beam device further comprises a booster for accelerating the primary charged particles after being generated by the charged particle beam source and/or a retarder for decelerating the primary charged particles prior to impinging onto the specimen. The booster may comprise a biased grid or cylinder for generating an accelerating field. Typically, the booster is additional to the accelerating component within the charged particle beam source and accelerates the beam typically to energies of up to 10 keV in order to minimize the travel time of the primary charged particles thereby minimizing the charged particles interactions. The retarder serves to decelerate the fast travelling primary charged particles typically to energies between 0 and 3 keV. The retarder may comprise two electrodes for generating the retarding field. The retarder may be integrated in an objective lens unit.

According to another aspect of the present invention, a charged multi-beam device having two, five, ten or even fifteen charged particle beam devices as described herein is provided. Typically, the several charged particle beam devices are arranged such that a row of charged particle beams is provided. Alternatively, they can be arranged such that an array of charged particle beams is provided.

According to another aspect of the present invention, a method for inspecting a specimen is provided with the following steps:
  directing a primary charged particle beam onto a specimen to generate a beam of secondary charged particles on the specimen;
  dividing the beam of secondary charged particles into a beam of high energy particles and a beam of low energy particles;
  detecting the high energy particles of the divided beam; and
  detecting the low energy particles of the divided beam,
wherein dividing is carried out at a position between the position of detecting the high energy particles and the position of detecting the low energy particles, and wherein detecting the high energy particles and/or detecting the low energy particles comprises angle sensitive detection.

This method allows the inspection of a specimen wherein the secondary charged particles of all energies are detected and analysed. Detection of the high energy particles and/or of the low energy particles is accomplished in an angle-sensitive way. In one embodiment of the method, dividing of the beam of the secondary charged particles is done by the use of an electrostatic field which is typically oriented essentially parallel to the direction of the incoming beam of the charged particles. Typically, after dividing is carried out, the travelling direction of the low energy particles is substantially opposite to the travelling direction of the high energy particles. According to one aspect of the present invention, the method comprises the step of separating the primary charged particle beam and the secondary charged particle beam. In another embodiment, the method according to the present invention comprises the step of changing the direction of the secondary charged particle beam, typically at between 70° and 110° and most typically between 80° and 100° with respect to the primary charged particle beam propagation direction. According to another embodiment, the method comprises the step of focusing the beam of secondary charged particles such that the focus lies approximately at the position where dividing is undertaken.

BRIEF DESCRIPTION OF THE DRAWINGS

Some of the above indicated, and other more detailed aspects of the invention, will be described in the following description and partially illustrated with reference to the figures. Therein.

DETAILED DESCRIPTION OF THE DRAWINGS

Figure 1:
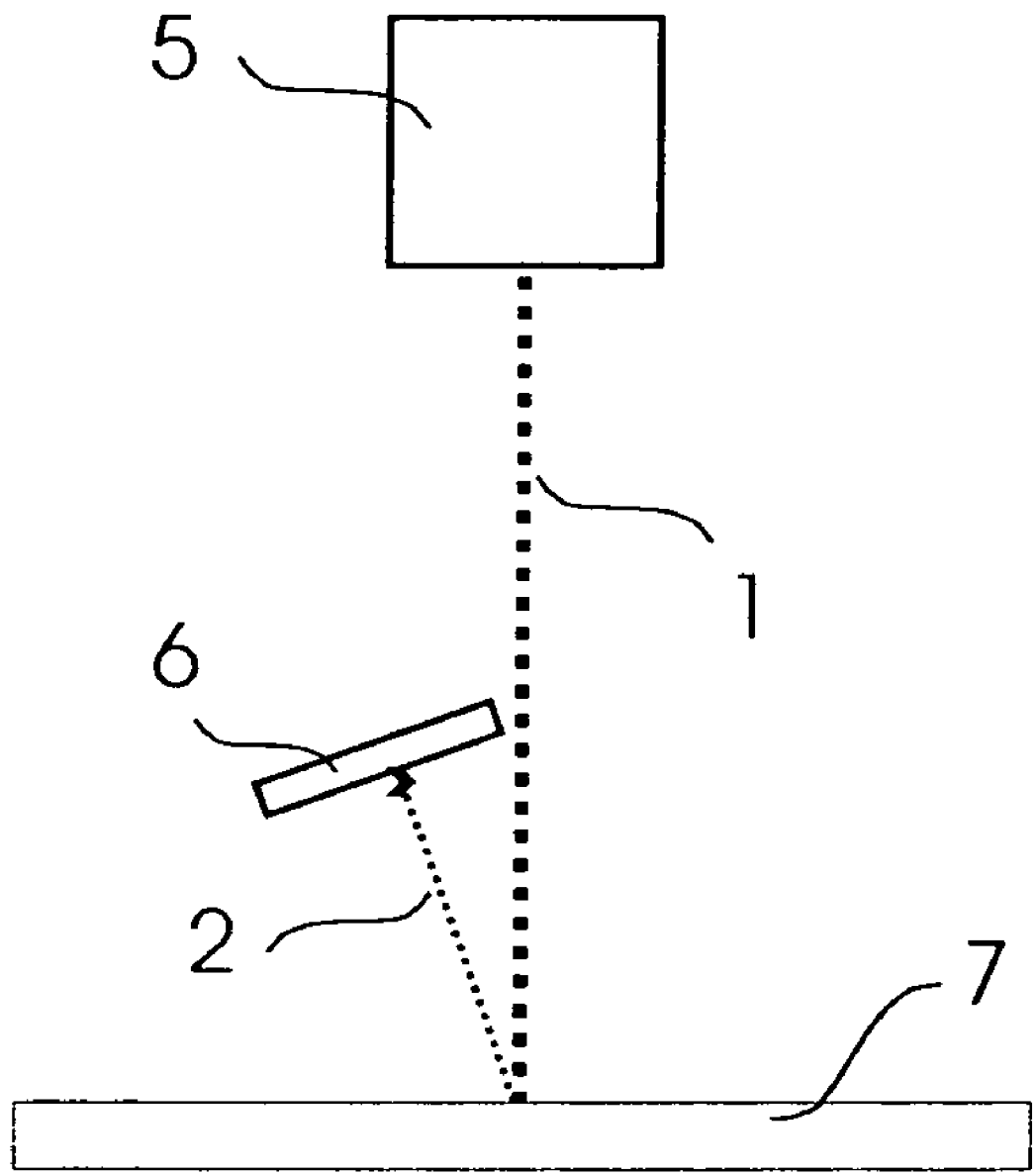
FIG. 1 shows a charged particle beam device in the state of the art.

Within the following description of the drawings, the same reference numbers refer to the same components. Generally, only the differences with respect to the individual embodiments are described. It is to be understood that in the drawings only those elements are shown which are essential for the present invention or help in understanding the invention.

Without limiting the scope of protection of the present application, in the following, the different aspects of the present invention are explained on the basis of electrons as charged particles. However, the present invention can still be applied for apparatuses and components using other sources of charged particles and/or other secondary charged particles to obtain a specimen image.

In the following, an analyzing system, a charged particle beam device and a charged particle multi-beam device according to the present invention are shown. Furthermore, a method for inspecting specimens will be described. Without limiting the scope of the invention, the analyzing system is explained in the context of a charged particle beam device. It is to be understood, however, that the analyzing system might be used in other applications too.

Figure 2A:
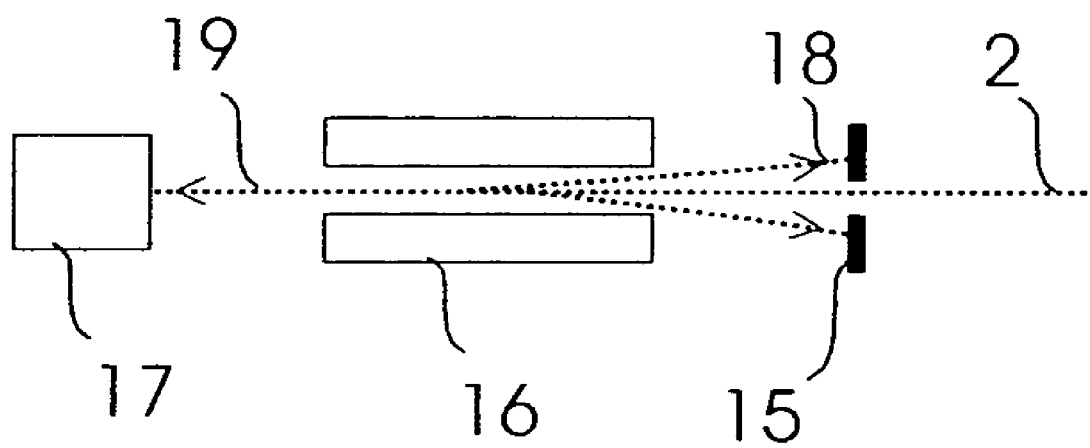
FIG. 2a shows a first embodiment of the analyzing system according to the present invention.

FIG. 2a shows an embodiment of the analyzing system according to the present invention. Charged particles, e.g. secondary electrons 2 pass through the middle hole of the reverse detector 15 on their way to the divider 16. The divider's potential is such that it forms a potential barrier (potential hill, potential saddle) within the divider. High energy electrons 19 are able overcome this potential barrier and keep propagating to the front detector 17. The low energy particles 18 are too slow to overcome the potential barrier and are accelerated back to the reverse detector 15. The front detector 17 and/or the reverse detector 15 are segmented in order to allow angular sensitive detection.

Figure 2B:
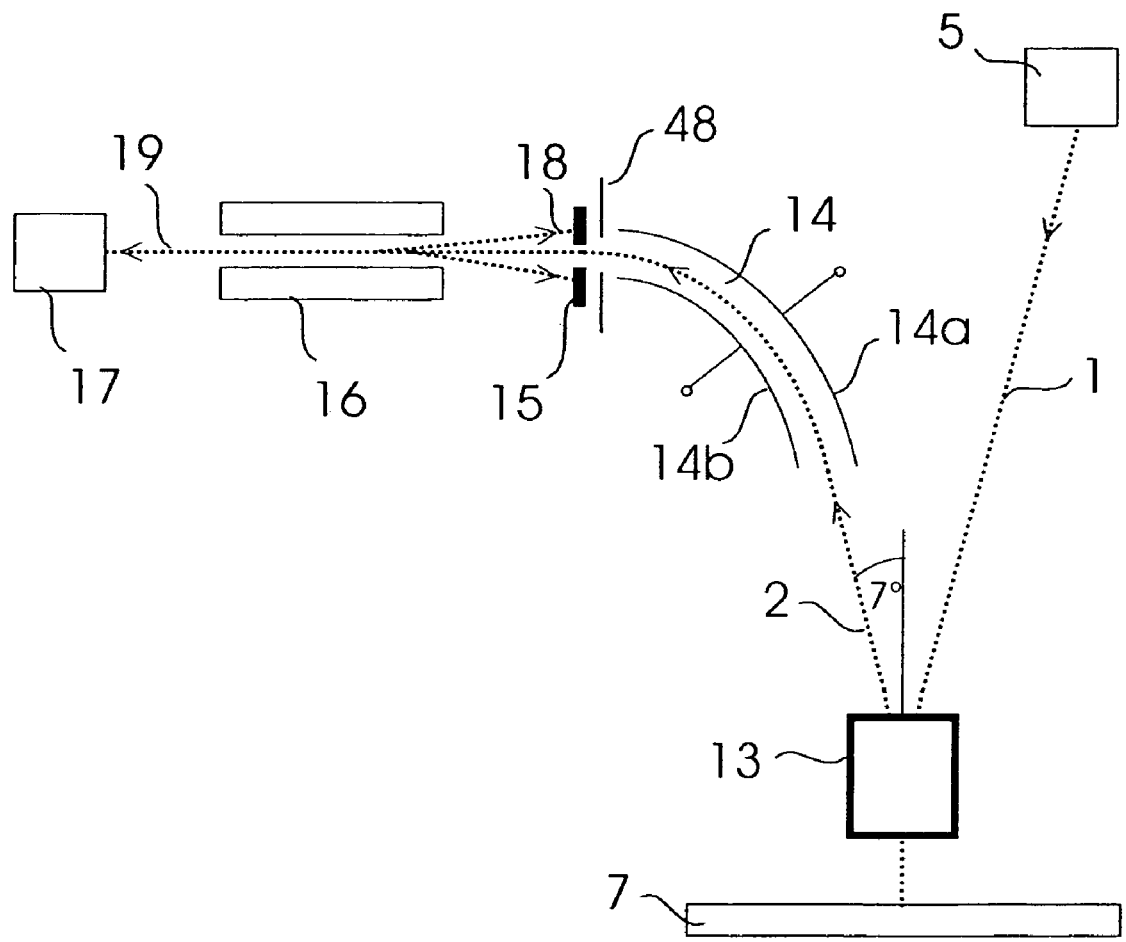
FIG. 2b shows a schematic view of the first embodiment of a charged particle beam device with an analyzing system according to the present invention.

FIG. 2b shows a first embodiment of a charged particle beam device having an analyzing system according to the present invention. A beam of primary charged particles 1 is generated in charged particle source 5. On its way to the specimen 7, the primary charged particles pass the deflector 13 and are deflected. After being focused on the specimen by a lens (not shown), the beam of primary charged particles undergoes different interactions with the specimen resulting in secondary charged particles wherein, as explained above, the term "secondary charged particles" refers to all particles leaving the specimen. Those secondary charged particles 2 that go through the deflector 13 are deflected towards the bending sector 14. In general and not limited to the embodiment of FIGS. 2a and 2b, the deflector can be an electrostatic, magnetic or a combined electrostatic magnetic type deflector. For instance, in FIG. 2b it is a magnetic type deflector imposing a force on the secondary electrons which is substantially opposite to the force imposed on the primary electrons. The advantage of a magnetic deflector is that the deflection depends on the propagation direction. Thus, two antiparallel beams of particles, whose particles are either charged positively or charged negatively, are deflected to the opposite direction, respectively. If the charge of the primary charged particles differs in its sign from the sign of the secondary charged particles charge, in general, it may be useful to apply an electrostatic deflector generating an electrostatic field for separating the secondary charged particles from the primary charged particles. In this way also the primary charged particles are deflected in an opposite direction to the secondary charged particles. This will be shown with respect to FIG. 6 below. The deflection angle is typically between 5° and 15°; in the embodiment shown in FIG. 2b, the deflection angle is about 7°. However, deflection angles of up to 20° or even higher are possible.

Generally, bending sectors that might be combined with the embodiments disclosed herein might be electrostatic, magnetic or combined electrostatic-magnetic. Since the space required for an electrostatic bending sector is smaller than the space needed for a sector including a magnetic part, typically an electrostatic sector is used. An electrostatic bending sector may be two electrodes which are shaped roundly. Sector 14 in FIG. 2b has a negatively-charged electrode 14a and a positively-charged electrode 14b serving to bend the electron beam. Thereby, the electron beam is focused in one dimension and, additionally, is kept at a high energy to avoid time of flight effects which may have impact on high-speed detection. A focusing in the second dimension takes place in quadrupole element 48. Thereby, the sector 14 and the quadrupole form a double-focusing sector unit. The quadrupole element 48 could also be applied in the other embodiments described herein. Optionally, a pair of bending sector side plates can be provided. Further, it may be possible to use a cylinder lens instead of a quadrupole to obtain double focusing.

In FIG. 2b the beam of secondary charged particles is deflected at about 90° in respect to the beam of primary charged particles. However, other values between 30° and 110°, typically between 45° and 95° or between 60° and 85°, are also possible. Additional to the deflection, the beam is typically also focused, as described already above. One advantage of applying a bending sector is that the beam of secondary charged particles is guided away from the direct vicinity of the primary charged particle beam. Thus, analysis tools as the above presented analysis system can be applied in the charged particle beam device without the need to fit them into the limited space nearby the primary charged particle beam and furthermore, without leading to undesirable interactions with the primary charged particle beam.

Figure 3A:
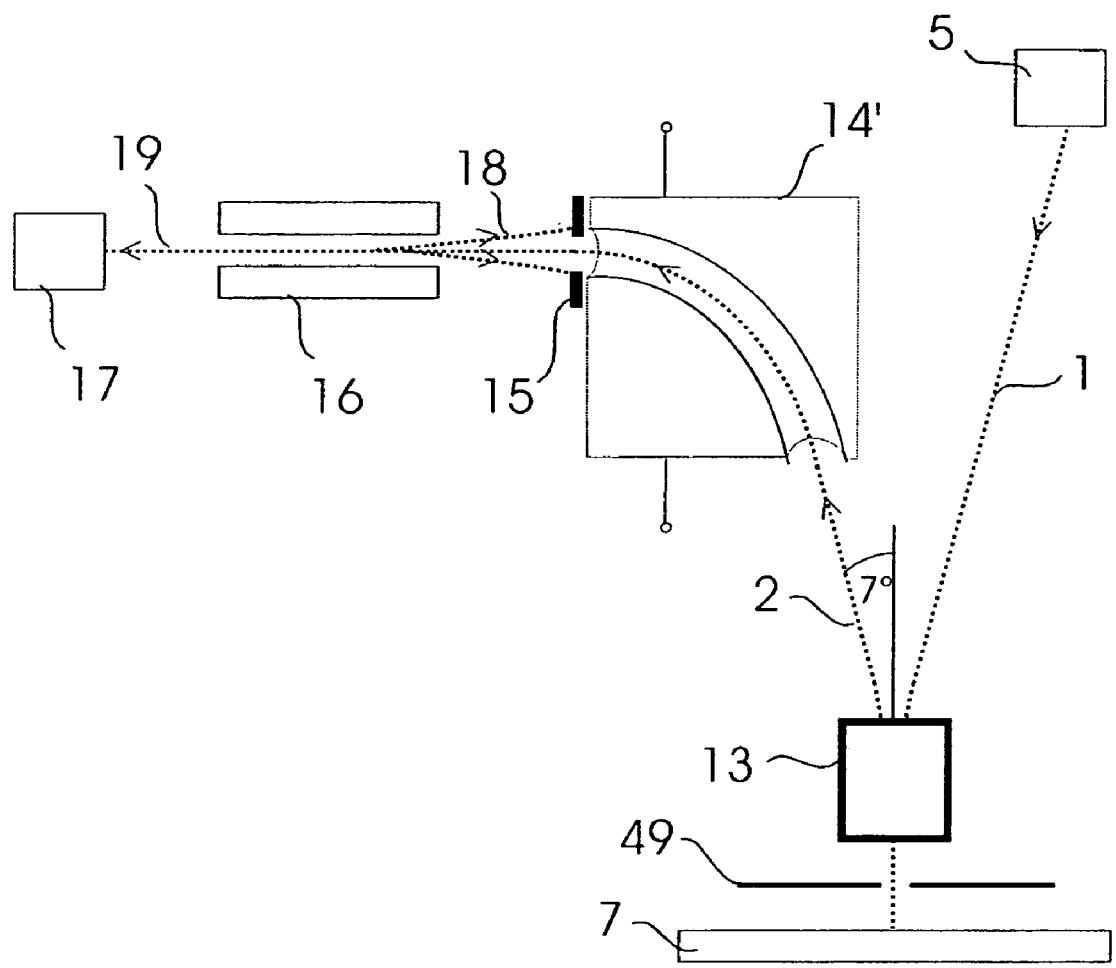
FIGS. 3a and 3b show schematic views of the second and third embodiment of a charged particle beam device with an analyzing system according to the present invention.
Figure 3B:
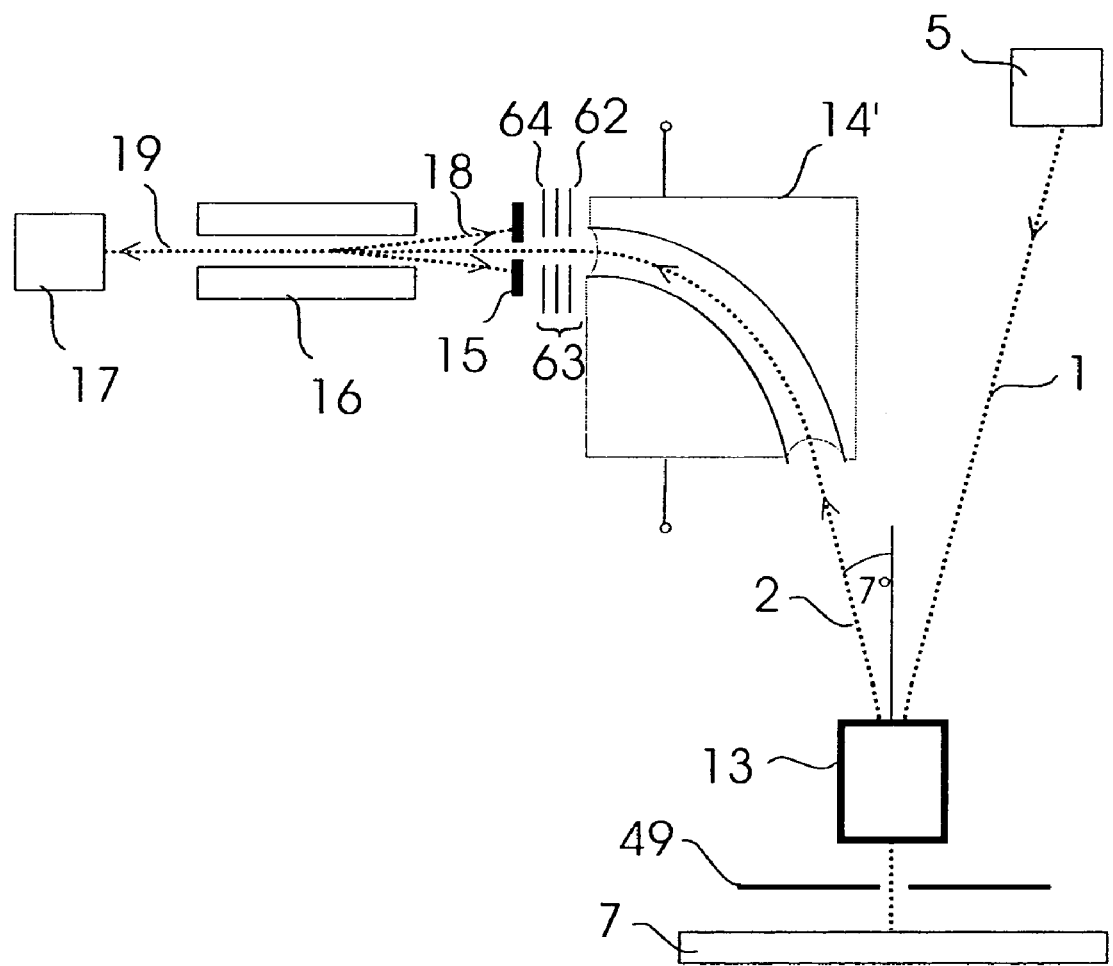

Instead of the electrodes 14a and 14b shown in FIG. 2b, which may optionally be provided with additional side plates, the bending sector in FIGS. 3a and 3b is shown as a hemispherical sector 14'. The hemispherical sector allows for the two-dimensional focusing of the beam. Thus, no additional focusing unit is required for the double focusing sector unit 14. Electrons can be divided according to their energy in divider 16 with high transparency. Generally, an electrostatic beam bending sector can be either cylindrical or hemispherical. The cylindrical type suffers from the fact that as the beam is bent the secondary electrons are focused in one plane and not in the other. A hemispherical bending sector focuses the secondary beam in both planes. The cylindrical sector can be used with side plates biased to achieve focusing in the transverse plane, yielding similar focusing properties to the hemispherical sector. For instance, side plates (not shown) could be positioned with respect to the perspective of FIG. 2b in front of and behind the gap between the sector electrodes 14a and 14b. There are two motivations for uniform focusing action by the bending sector. One is to provide for a small spot on the high-speed detector and the other is to enable good energy filtering because the divider is sensitive to both energy and direction of the secondary beam.

The divider is typically positioned approximately in the focus of the bending sector or the additional optics that is placed between bending sector and divider.

After the bending sector 14, the beam of secondary charged particles enters a divider 16. The divider is shown as a cylinder or tube and divides the beam of incoming particles into a beam of low energy secondary charged particles 18 and a beam of high energy secondary charged particles 19. Hence, the image derived from the front detector is high-pass filtered and the image derived from the reverse detectors contains the complementary information of the low-pass filtered secondary charged particles. The high energy charged particles 19 move on to the front detector 17 whereas the low energy charged particles 18 move back to the annular shaped reverse detector 15, their flight direction is substantially reversed by the divider 16. Thus, with this set-up, an energy sensitive detection of the secondary charged particles can be carried out.

Generally, the divider provided for the embodiments disclosed in the present application is typically formed as follows. It is desirable for a high current density apparatus to provide a high transparency and a high collection efficiency for the secondary particles. Thus, electron losses have to be reduced. Providing a divider with a single opening increases the possibility of having almost all electrons of an electron beam pass through the divider. Otherwise, losses may occur between hardware components bridging different openings.

The cylinder like (or aperture-like) dividers shown in the figures form a potential barrier that varies depending on the beam path in the divider. Thereby, for a cylinder with a round footprint, the dependency is only radial. For cylinders having quadratic footprints, pentagon footprint or other shapes as a footprint, which may be used for other reasons, the potential shape varies with the distance from the axis as well as an azimuth coordinate.

The longer the cylinder, the closer the threshold potential is to the potential applied to the divider. For short dividers, the potential-barrier may vary significantly from the applied bias. However, space requirements may justify this. Additionally, the mean particle velocity in the divider decreases for long filters. Thus, in view of a high-speed requirement the length may also be limited. As an example, the length of the divider may be within the range of 200 µm to 20 mm. The aperture for having the beam pass there through may be within the range of 200 µm to 10 mm.

Figure 10:
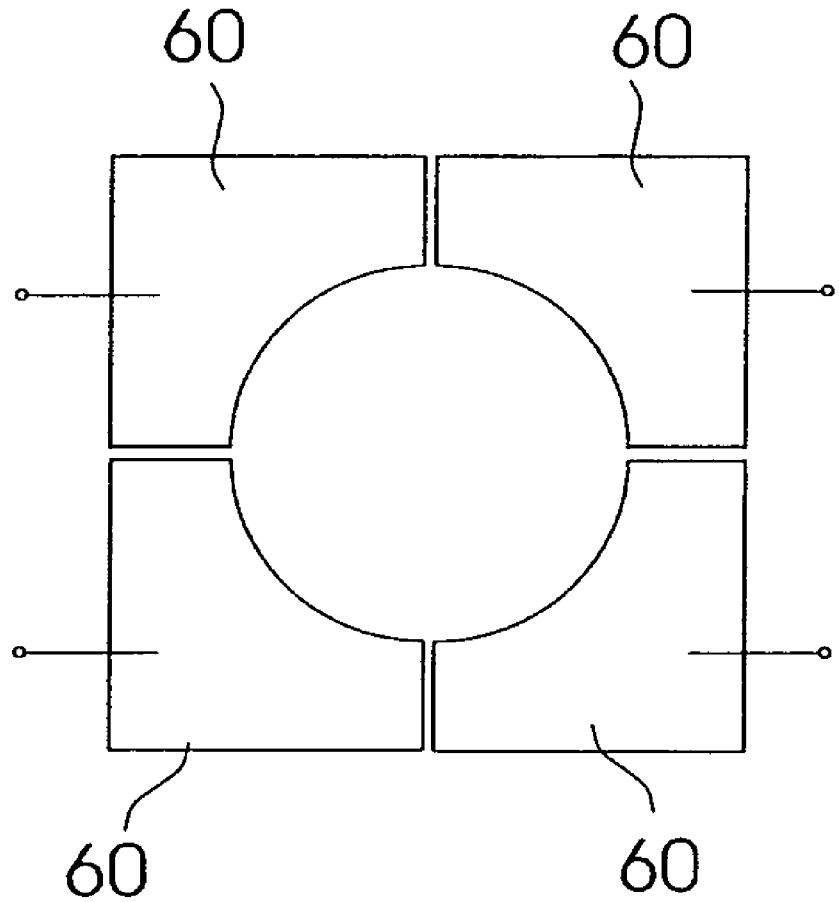
FIG. 10 shows a schematic view of an embodiment of a divider of an analyzing system according to the present invention.

There are in general two possibilities for avoiding that secondary charged particles will be filtered or reversed in the divider differently depending on their position within the divider. This can be done either by a deflection unit such as a segmented ground plate 64 that is disposed upstream of the divider and that directs the beam always to the center of the potential saddle within the divider, or by amending the potential characteristics. In order to amend the potential, an additional dipol potential could be applied, e.g. by providing a divider 16 consisting of four electrodes 60 which can be biased separately, as it is shown in FIG. 10. FIG. 10 shows a cross section of a divider that is perpendicular to the cross sections shown in FIGS. 2-4 and 6-8.

The focusing of the double focusing bending sector unit (14 and 48 in FIG. 2b or 14' in FIGS. 3a and 3b) can be assisted with additional focusing units, e.g. an electrostatic lens. Examples for electrostatic lenses are Einzel-lenses or immersion lenses. In FIG. 3b a set of focusing and filtering elements is shown, which are positioned downstream of the bending sector, to focus the secondary electron beam to a small (e.g., 4 mm diameter) spot on the active area of the detectors and to enable energy filtering of the secondary electron beam. Focusing can be done either with magnetic lenses or electrostatic lenses. Electrostatic lenses offer a more compact size and reduced complexity.

In the embodiment of FIG. 3b, the focus lens is an electrostatic lens comprising the secondary electron align quadrupole 62 and segmented ground plate 64 surrounding with a focusing electrode, thereby forming a lens 63. Lens 63 can be an immersion lens or an Einzel-lens. In the event the specimen is biased, the plates 62 and 64 may be grounded.

Within the above-described embodiment, the quadrupole 62 and the plate 64 are integrated in the lens 63. Generally, with regard to all embodiments shown in this application, it is possible that the quadrupole and/or the plate are provided independently of the lens. Thereby, an appropriate number of lens electrodes is provided and additionally the electrodes of the quadrupole 62 and the plate 64 are provided. Further, it is possible that instead of the plate 64 a quadrupole is provided. This second quadrupole would allow for additional alignment of the secondary electron beam.

It shall be added that the additional lens units such as lens 63 can be applied in all embodiments described herein. This is especially true for the embodiments having a bending sector 14 consisting of bent electrodes with or without additional side plates.

Figuratively spoken, the combination of the divider and two detectors acts as an aperture hole with an adjustable diameter: With the divider not biased at all, all charged particles in the divider keep on moving in the direction of the front detector. With increasing bias of the divider, more charged particles turn within the divider back to the reverse detector. There is a maximum energy above which no particle has enough energy to overcome the potential barrier of the divider in order to get through to the front detector; instead all particles will be returned to the reverse detector.

In one embodiment of the analyzing system according to the present invention, the divider comprises a biased electrode. This electrode has an aperture for enabling the charged particle beam to pass through. In another embodiment, the divider is provided in the form of a biased cylinder. Typically, the biased cylinder has a length of at least 100 µm, e.g. 120 µm or larger, 150 µm or larger or 200 µm or larger, and an aperture diameter of between 100 µm and 20 mm, e.g. between 150 µm and 10 mm or between 0.5 mm and 1 mm.

The divider forms a potential barrier, whereby charged particles of the charged particle beam are redirected if their energy is below the potential-barrier value. The high energy charged particles are able to overcome the potential barrier. They keep on moving until they impinge at the front detector. The low energy charged particles cannot overcome the potential-barrier and are accelerated back from the divider towards the at least one reverse detector.

For example, the at least one reverse detector may be ring-shaped having a hole in the middle. The at least one reverse detector may also be composed of several single detectors, wherein the composition of the single detectors and the arrangement of the composition of the detectors does not prevent the essential part of the secondary charged particle beam from propagating from the bending sector to the divider.

In general, as it is shown in FIGS. 2a, 2b, 3a and 3b, the front detector, divider and reverse detector can be arranged in one line, thereby consuming as little space as possible.

The extraction of secondary electrons released by the specimen may be controlled by a proximity electrode. This electrode is shown in FIGS. 3a and 3b by electrode 49. Afterwards an accelerating unit like a biased part of the objective lens (not shown), e.g. a biased pole piece, or a biased part of the housing (not shown) or a further acceleration electrode (not shown) accelerates the electrons for improved high speed detection. This acceleration can be included in all embodiments described in the present application and has the advantage that the collection efficiency can be increased if secondary particles are accelerated in a predefined acceleration field. The field of the proximity electrode can be adjusted according to the specific application for control of the imaging conditions. Afterwards, typically, the charged particles are accelerated, for example up to 5-12 keV or the like, by the acceleration unit.

The above-mentioned acceleration unit is biased relative to the wafer potential. That is, it can either be biased to a potential while the wafer is on ground potential, it can be grounded while the wafer is biased to a different potential, or both parts can be biased to obtain a desired potential difference. In order to maintain the high energy of the electrons, they should propagate within a tube or column that is also biased. This will be shown in more detail in FIG. 7.

Figure 4:
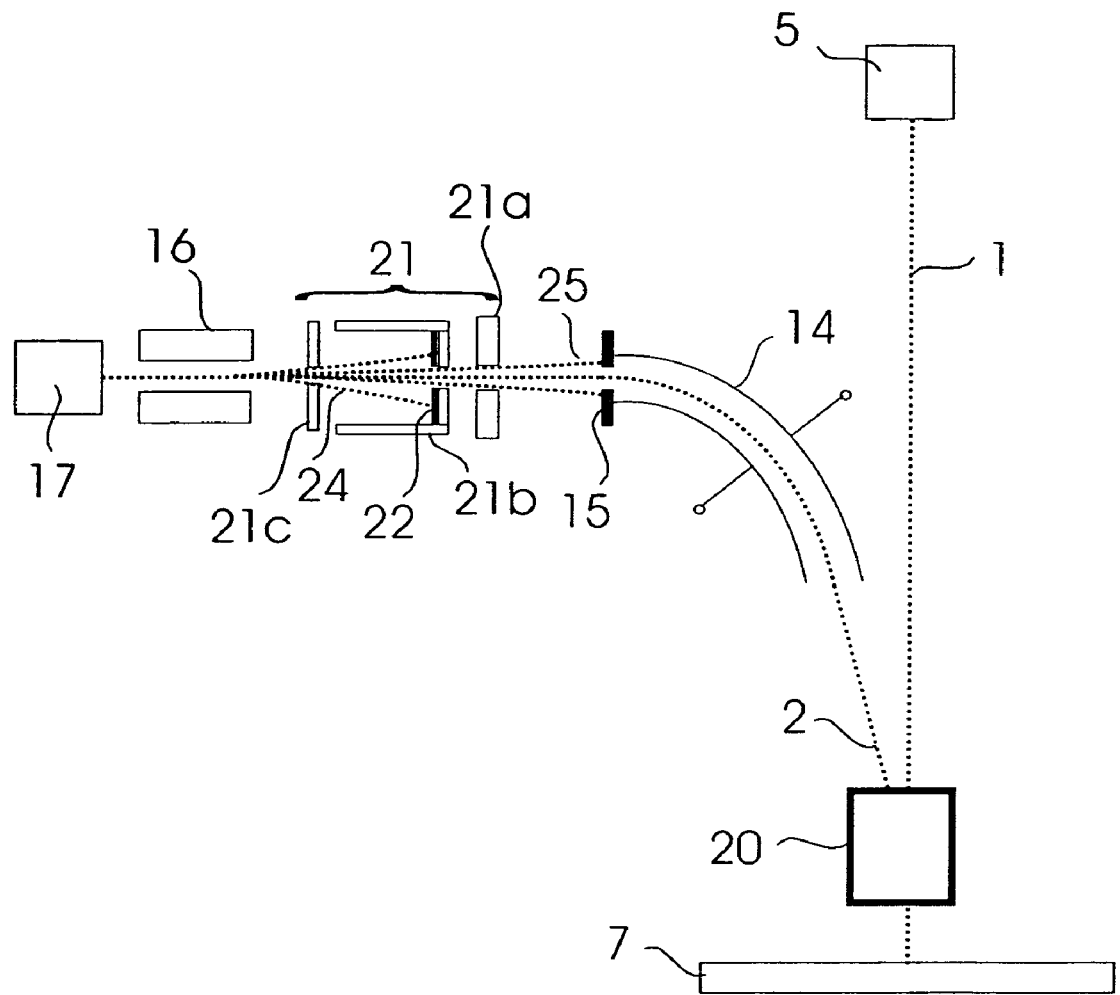
FIG. 4 shows a schematic view of the fourth embodiment of a charged particle beam device with an analyzing system according to the present invention.

FIG. 4 shows another embodiment of the present invention. Instead of a deflector 13, a Wien-filter 20 is used. The Wien-filter can be adjusted such that it does not change the propagation direction of the primary charged particles 1, but does deflect the secondary charged particles 2.

The beam of secondary charged particles 2, that passes the bending sector 14, is guided through an Einzellens 21 for focusing, wherein the Einzellens comprises two electrodes 21*a* and 21*c* and the middle unit 21*b*. An Einzellens provides good focusing properties and is typically positioned upstream of the divider, most typically between the divider and at least one of the at least one reverse detector. As already mentioned above, other types of electrostatic, magnetic or combined electrostatic-magnetic lenses could be applied instead of an Einzellens.

In FIG. 4, two reverse detectors are shown. Reverse detector 22 is capable of detecting one group of low energy charged particles 24 whereas reverse detector 15 is capable of detecting another group of low energy charged particles 25. That is, one reverse detector is capable of detecting those low energy charged particles 25 which have a small off-beam motion and one reverse detector is capable of detecting those low energy charged particles 24 which have a more extensive off-beam motion.

Figure 5A:
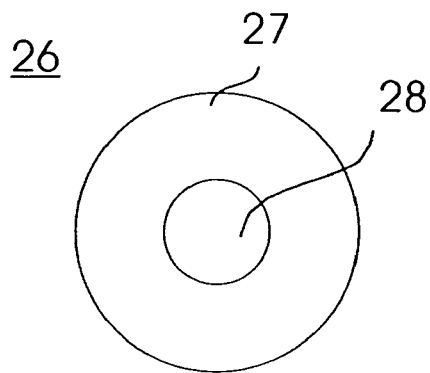
FIG. 5a-d show schematic views of various embodiments of detectors suitable for use as front and reverse detectors.

In FIG. 5*a-d*, different detector types are shown. FIG. 5*a* is a segmented detector 26 which may be used as a front detector in the present invention, for example, as front detector 17 in the embodiments of FIG. 2*a*, 2*b*, 3*a*, 3*b* or 4. The detector is radially segmented, i.e., it provides an inner zone 28 and an outer zone 27. Thus, this detector is capable of distinguishing the charged particles dependent on their deflection level.

In general, secondary particles starting from a flat surface of the specimen with enough energy will reach the front detector in the inner zone 28 close to the centre. Secondary particles which start from an inclined surface of the specimen with enough energy will generally land in the outer zone 27. This segmentation allows to detect the secondary charged particles according to their starting angle providing information on the local surface inclination at their starting position. The signal from the untilted surface is the analogy to the light optical Bright Field (BF) image, while the signal reaching the outer zones of the detector is analogous to the light optical Dark Field (DF) image. Hence, using the segmented detector 26 as front detector allows for the detection of secondary electrons dependent on their starting angle and thus the localization of surface inclination at their starting position.

Figure 5B:
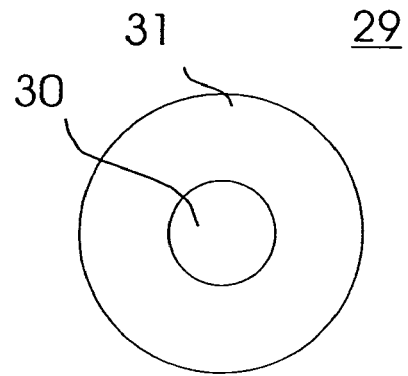

The detector 29 as shown in FIG. 5*b* may be used as a reverse detector in the present invention, for example, as reverse detector 15 or 22 in the embodiments of FIG. 2*a*, 2*b*, 3*a*, 3*b* or 4. The detector 29 is annular ring-shaped with a through hole 30 in the middle in order to allow the secondary charged particles to pass on their way towards the divider. The reverse detectors will typically produce a dark field type of image since the filter tends to suppress electrons with large starting angles and the central portion of the reflected beam may be lost in the through hole of the detector which is necessary in this embodiment for beam passage. The detector 29 provides an outer zone 31 for detecting the low energy charged particles. In general, due to the hole 30 in the middle of the reverse detectors a central portion of the reflected beam will be lost.

Figure 5C:
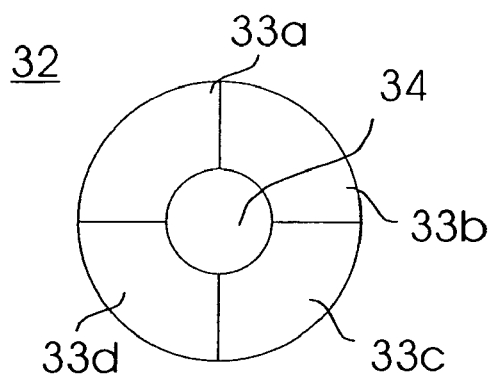
Figure 5D:
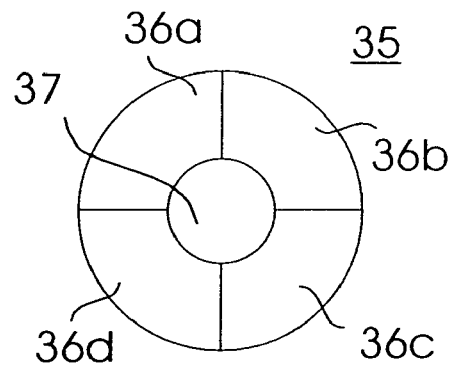

In FIG. 5*c*, there is shown a segmented detector 32 which may be used as a front detector in the present invention, for example, as front detector 17 in the embodiments of FIG. 3*a*, 3*b* or 4. The detector is segmented in both the radial and circumferential orientation, i.e., it provides an inner zone 34 and four outer zones 33*a*-33*d*. Thus, this detector is capable of distinguishing the charged particles dependent on their deflection level and on their deflection orientation. Since the starting conditions of the secondary charged particles depend on the local surface topography and the secondary charged particles landing point on the detector also depends on the azimutal orientation of the starting velocity, topography information can be derived if the detector surface is segmented, for instance, as shown in FIG. 5*c*, into quadrants 33*a*-33*d*. This is especially useful for the Dark Field zones of the detector. It has the additional advantage of reducing the size of the individual detector zones and hence improving the detection bandwidth in the case of pin diodes. As will be apparent for a person skilled in the art, the outer zone 33 of the detector may also be segmented into more or less than four zones, e.g., 6, 8, 10 or even more. Moreover, the detector could also be segmented in more than two radial zones, e.g., an inner zone, a middle zone and an outer zone. In case of more than one radial zone, all radial zones may be individually segmented or may be segmented similarly to a neighboring zone. The detector 35 as shown in FIG. 5*d* may be used as a reverse detector in the present invention, for example, as reverse detector 15 or 22 in the embodiments of FIG. 3*a*, 3*b* or 4. The detector 35 is ring-shaped and segmented into four outer zones 36*a-d*. The through hole 37 in the middle of the detector allows the secondary charged particles to pass through on their way towards the divider. The segmentation of the outer zone allows the detection of the low energy charged particles dependent on their deflection direction. As will be apparent for a person skilled in the art, the outer zone 36 of the detector may also be segmented into more or less than four zones, e.g., 6, 8, 10 or even more. Besides, the outer zones could further be segmented into an inner part and an outer part of the outer zone, etc.

In summary, using segmented detectors offers several advantages: Since the starting conditions of the secondary electrons depend on the local surface topography and the landing point on the detector depends inter alias on the azimuth share of the starting velocity vector, topography information can be derived. This is particularly useful for the outer zones and for the detector. Moreover, by the use of segmented detectors the size of each individual detector zone can be reduced. In the case of pin diodes, the detection bandwidth can thus be improved.

Figure 6:
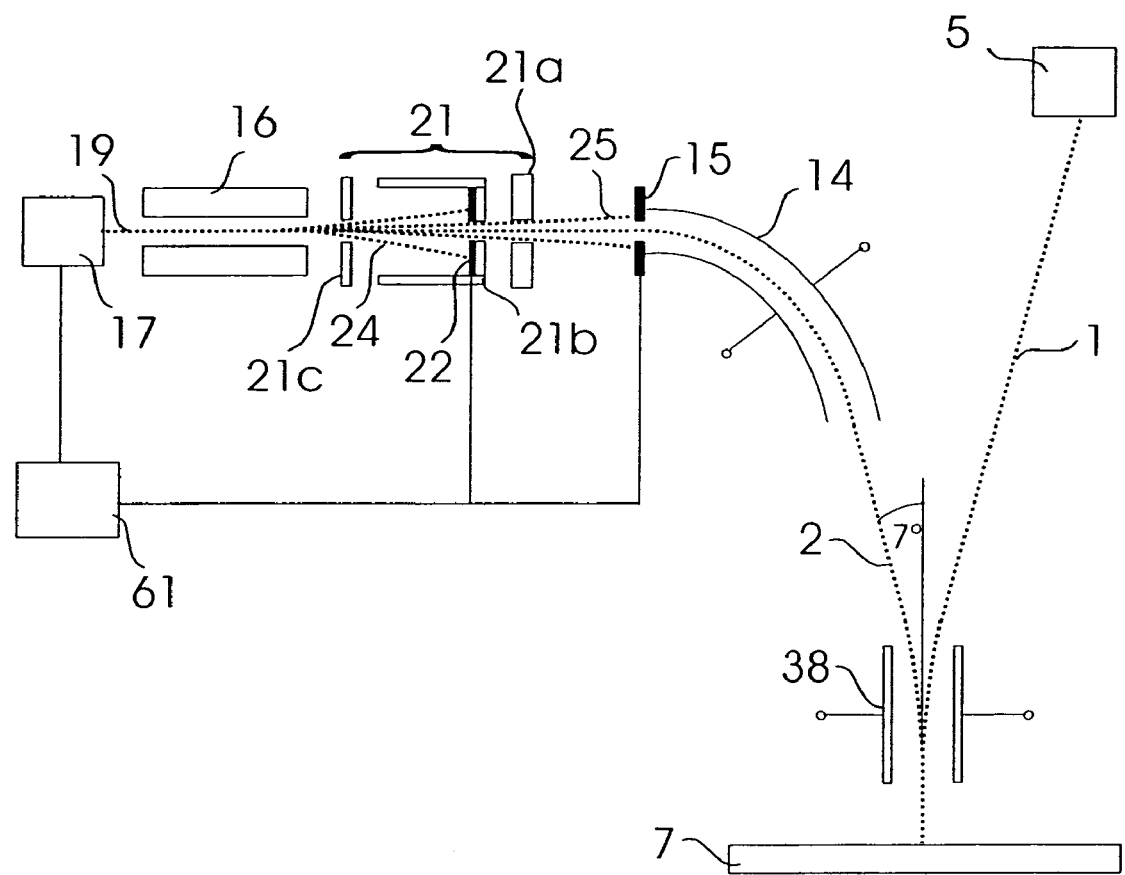
FIG. 6 shows a schematic view of a fifth embodiment of a charged particle beam device with an analyzing system according to the present invention.

FIG. 6 shows a further embodiment of the present invention. In FIG. 6, the source 5 is an ion source generating a primary charged particle beam 1 consisting of ions as charged particles (focused ion beam (FIB) system). The particles are deflected by the electrostatic deflector 38 and undergo interactions with the specimen resulting in secondary electrons. The secondary electrons, that leave the specimen, are deflected within the deflector 38 in an opposite direction to that which the ions had been deflected to.

Furthermore, in FIG. 6 a calculation unit 61 is shown that is electrically connected to the front detector 17 and the two reverse detectors 15 and 22. The calculation unit receives signals from the detectors 15, 17 and 22 and performs a simultaneous evaluation of the signals. Thereby, the several signals from the respective detectors are typically used as inputs for algebraic computations. In general, a calculation comprises a plurality of computation steps and involves all signals from all detectors. For instance, the signals, i.e. the measured current from the detectors, may be commonly evaluated by adding them and/or by subtracting and/or by multiplying them. The more different types of evaluation are applied, the more information on the specimen can be gathered. The calculation unit is typically provided with a processor for calculation, at least one storage section, an input such as a keyboard and/or a mouse and an output. The output is typically a display, screen, or a printer. For instance, the calculation unit 61 could be a personal computer that is provided with adequate software. The calculation and the further processing is typically performed automatically without the need for an operator when the charged particle beam device is in use. Hence, the hardware devices such as input and output devices are primarily used for the set-up of the charged particle beam device, error treatment and the like. Although the calculation unit 61 is only shown in the embodiment of FIG. 6 for reasons of clarity, a calculation unit may also be applied in the other embodiments described herein.

Figure 7:
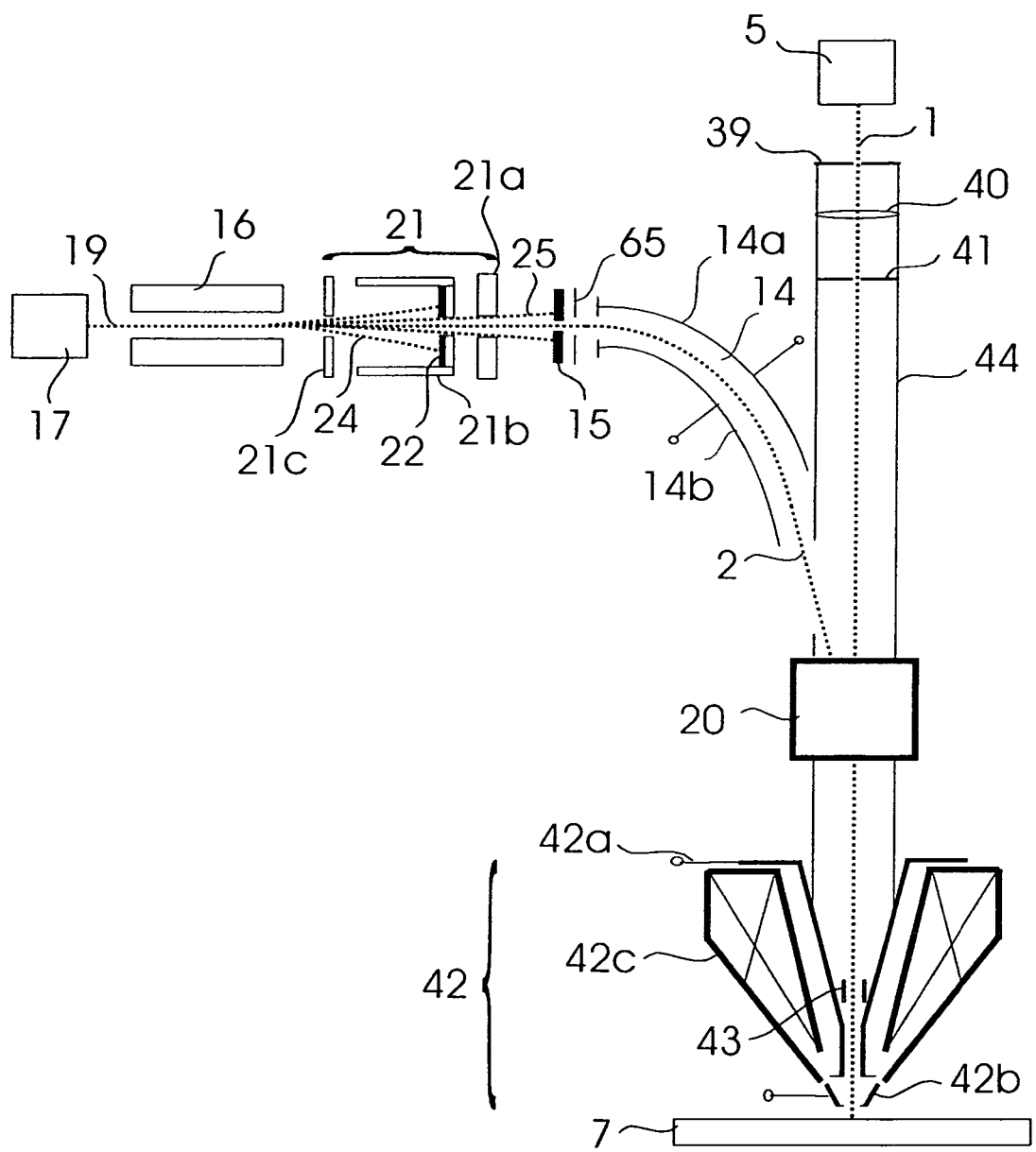
FIG. 7 shows a schematic view of a sixth embodiment of a charged particle beam device with an analyzing system according to the present invention.

FIG. 7 shows a further embodiment of the present invention. A charged particle beam source 5 generates a beam of primary charged particles which is subsequently accelerated by booster 39 which is shown as an electrode in FIG. 7. Acceleration of the beam is advantageous in that it reduces the inter charged particle interaction within the beam significantly and furthermore, results in a reduced sensitivity to stray fields. After acceleration the beam passes a condenser 40 and a final aperture 41. As already explained in view of FIG. 4, the beam of primary charged particles passes a Wien-filter 20. In order to keep the particles on a high energy, the beam of primary charged particles is enclosed in a tube 44 which is on a high potential.

There is an objective lens 42 shown close to the specimen 7. The objective lens comprises the magnetic lens 42c. In addition, the objective lens 42 provides an electrostatic assembly comprising an upper electrode 42a and a downer electrode 42b. Typically, the electrodes are biased in such a way that they slow down the primary charged particles which had been accelerated by the booster 39 by generating a retarding field for the primary charged particles. The secondary electrons are accelerated by the electrostatic field. The scanning unit 43 is typically positioned within the lens 42 but could also be positioned between lens and specimen 7. The secondary electrons pass the Wien-filter 20 and head for the bending sector 14. Between the bending sector and the divider they are decelerated by a retarding electrostatic field generated by the electrode 65.

Although the tube 44 and the bending sector 14 have high potential, the bending sector 14 has to be isolated from the tube 44 in order to be biased such that the secondary electrons can be guided along the bent gap between the electrodes 14a and 14b. The further set-up shown in FIG. 7 is well-known from the embodiment of FIG. 4.

In a typical embodiment of the present invention, the tip of the charged particle beam source 5, and the specimen 7, are biased, e.g. with −8 kV, whereas the booster 39, and the tube 44, are on ground potential. Hence, the energy of the primary electrons within the tube is about 8 keV. In this embodiment, the path, on which the secondary electrons propagate within the bending sector, is also on ground potential. This is achieved by adequately biasing the two electrodes 14a and 14b. Furthermore, the front detector 17 and the reverse detector 15 are on ground potential whereas the reverse detector 22, which is located within the lens assembly 21, is biased.

Figure 8:
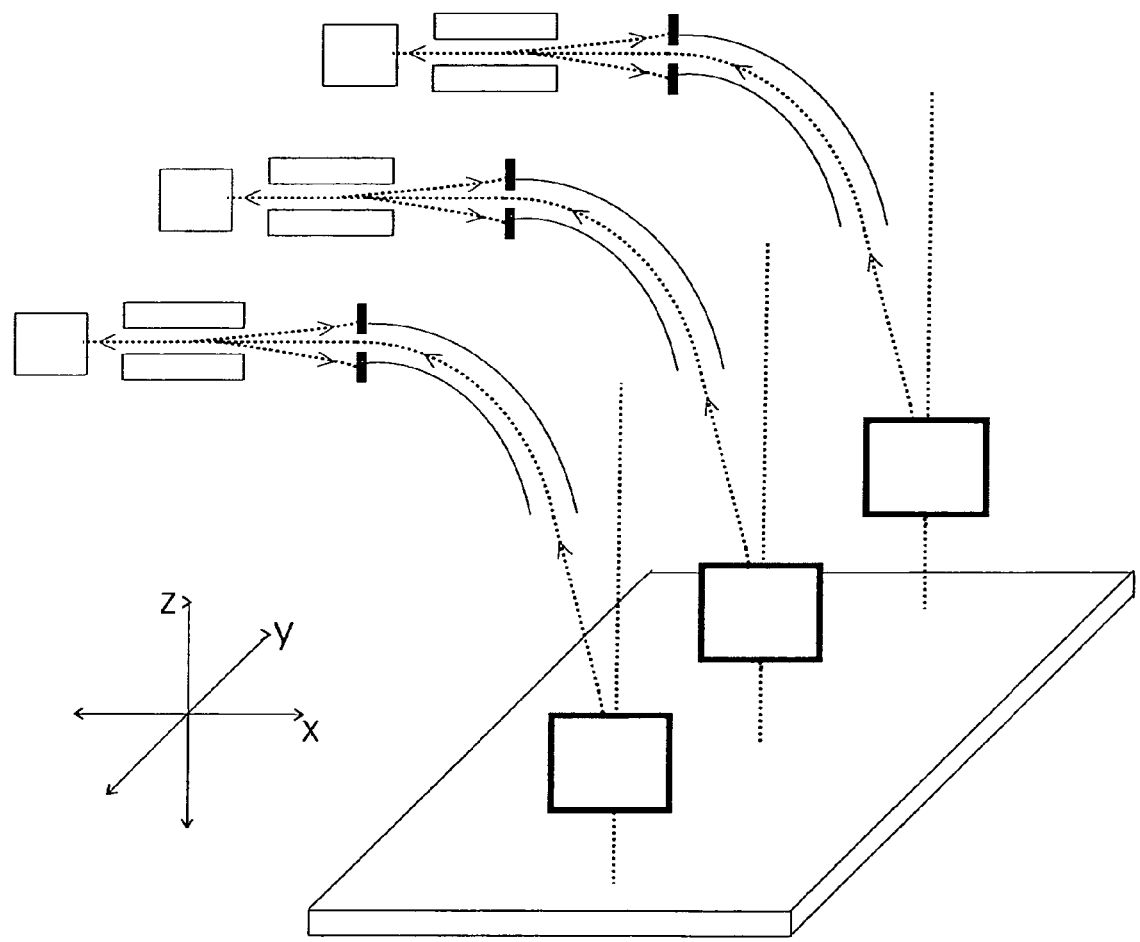
FIG. 8 shows a schematic view of an embodiment of a charged particle multi-beam device according to the present invention.

FIG. 8 shows schematically a multi-column charged particle beam device according to the present invention. Three charged particle beam devices, each having a divider, a front detector and a reverse detector, are arranged in an array in order to facilitate simultaneous imaging of a specimen. For a person skilled in the art it will be clear, that also two, four, five or even more, e.g. eight or ten, charged particle beam devices may be displaced in a column or an array of charged particle beam devices. The specimen table with the specimen disposed thereon may be movable in the x and y direction. Alternatively, or in addition, the array of charged particle beam devices may be movable in the x or y direction which are depicted in FIG. 8. This is also valid for the embodiments showing single charged particle beam devices. Furthermore, and in general, the charged particle beam device or the array of charged particle beam devices and/or the specimen table are typically movable in the z direction as well. The specimen and the charged particle beam devices described above are also moveable with respect to one another, typically in the x-, y- and z-direction.

Figure 9A:
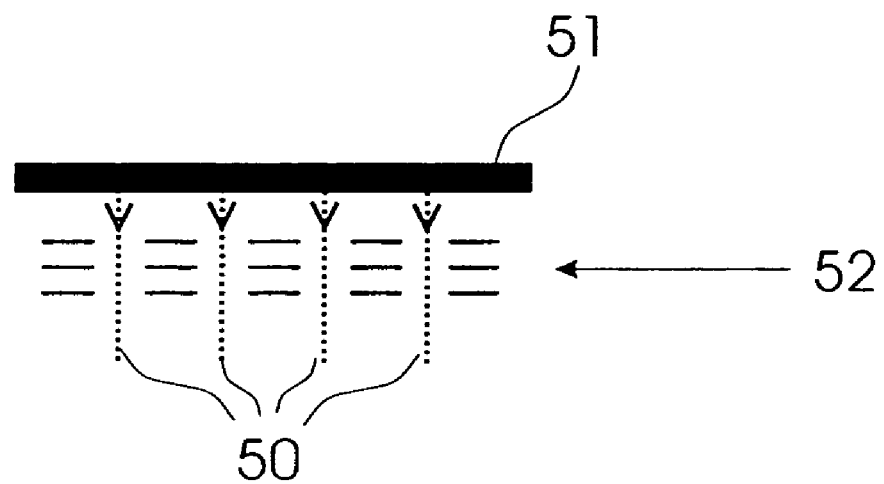
FIG. 9a, b show schematic views of embodiments of various components of a charged particle multi-beam device according to the present invention.

For arranging several charged particle beam devices in a line, in an array or other pattern, some of the components, that are individually acting on a single charged particle beam in the case of a single charged particle beam device, may be combined. Thus, as shown in FIG. 9a, one emitter array 51 emits all charged particle beams 50 or one objective lens 52 focuses all beams of the multi-beam device. For example, a magnetic focusing field could be induced to pole pieces by a common excitation coil. Each pole piece would be arranged close to the respective beam of primary or secondary charged particles. A controller (not shown) could drive the excitation coil and cooling units (not shown) could be located close to the excitation coil. The pole pieces guide the magnetic focusing field to openings for the electron beams. These openings are provided in upper pole pieces and lower pole pieces. Due to the focusing fields within the openings, the charged particle beam is focused. Thereby, several beams of charged particles are focussed by the use of only one common excitation coil. Hence, the field between the pole pieces for each beam is substantially identical.

Figure 9B:
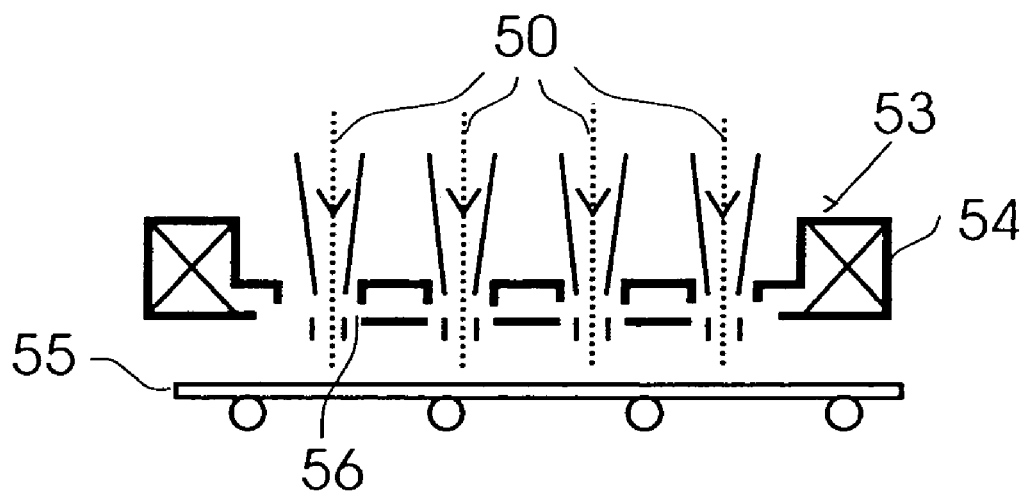

Such a multi-lens system could, for instance, be used as an objective lens. It may be an electrostatic, magnetic or compound electrostatic magnetic lens. In FIG. 9b a magnetic multi-beam objective lens 53 is shown with a common excitation coil 54 and individual pole pieces such as pole piece 56. The multi-beam lens 53 is disposed close above the specimen table 55 with a specimen placed thereon. However, the application of multi-lens systems is not limited to the objective lens. For instance, as shown in FIG. 9a, a common condenser lens 52 for the four charged particle beams could also be provided. Not shown in the drawings, but nevertheless possible are a common bending sector and a common divider.

The analyzing systems and devices, as described in the above embodiments, may also be used for transmission charged particle devices, e.g. a (scanning) transmission electron microscope, wherein the detection components are located below the specimen. Thereby, the detected charged particles would be scattered charged particles.

The invention claimed is:

1. An analyzing system for a charged particle beam device adapted for having a beam of primary charged particles therein, comprising:
    a divider adapted to divide a beam of charged particles into a low energy beam and a high energy beam;
    a front detector for detecting the high energy beam;
    at least one reverse detector for detecting the low energy beam; and
    a bending sector capable of deflecting the beam of charged particles,
    wherein the bending sector is positioned upstream of the at least one reverse detector with respect to the beam of charged particles, and wherein the bending sector is positioned off-axis of the beam of primary charged particles;
    wherein the divider is positioned between the front detector and the at least one reverse detector, and wherein the front detector or the at least one reverse detector are segmented.

2. The analyzing system according to claim 1, wherein the divider has a biased electrode comprising one aperture for letting pass through the charged particle beam.

3. The analyzing system according to claim 1, wherein the divider is positioned and shaped to generate an electrostatic field.

4. The analyzing system according to claim 1, wherein the at least one reverse detector is positioned and shaped for allowing the beam of charged particles to pass through it on its way to the divider.

5. The analyzing system according to claim 1, further comprising a calculation unit, wherein the calculation unit is coupled to the front detector and to the at least one reverse detector, for a joint evaluation of signal data from the front detector and the at least one reverse detector.

6. The analyzing system according claim 1, wherein the front detector or the at least one reverse detector are segmented in azimuth segments.

7. The analyzing system according to claim 6, wherein the front detector or the at least one reverse detector are segmented in azimuth segments to provide for a spatial resolution of particles from an incoming beam of charged particles with respect to an azimuth angle.

8. The analyzing system according to claim 1, wherein the front detector or the reverse detector are segmented in concentric detection segments to provide for a spatial resolution of particles from an incoming beam of charged particles with respect to a radial direction.

9. The analyzing system according to claim 1, wherein the at least one reverse detector are two reverse detectors.

10. A charged particle beam device for inspecting a specimen, comprising:
    a charged particle beam source for directing a beam of primary charged particles onto the specimen to generate a beam of secondary, scattered or backscattered charged particles;
    an analyzing system, comprising:
        a divider adapted to divide a beam of charged particles into a low energy beam and a high energy beam;
        a front detector for detecting the high energy beam;
        at least one reverse detector for detecting the low energy beam; and
        a bending sector capable of deflecting the beam of secondary, scattered or backscattered charged particles;
        wherein the divider is positioned between the front detector and the at least one reverse detector,
        wherein the bending sector is positioned upstream of the at least one reverse detector with respect to the beam of charged particles, and wherein the bending sector is positioned off-axis of the beam of primary charged particles;
        wherein the front detector or the at least one reverse detector are segmented, and
    wherein the beam of charged particles is the beam of secondary scattered or backscattered charged particles.

11. The charged particle beam device according to claim 10, wherein the bending sector is positioned upstream of the at least one reverse detector with respect to the beam of the secondary, scattered or backscattered charged particles.

12. The charged particle beam device according to claim 10, further comprising a lens unit for focusing the beam of secondary, scattered or backscattered charged particles, wherein the lens unit is positioned between bending sector and divider.

13. The charged particle beam device according to claim 12, wherein one reverse detector is positioned within the lens unit and one reverse detector is positioned between the bending sector exit and the lens.

14. The charged particle beam device according to claim 10, further comprising a deflector for separating the beam of primary charged particles and the beam of secondary, scattered or backscattered charged particles.

15. The charged particle beam device according to claim 10, further comprising an objective lens positioned to have both the primary charged particle beam and the secondary, scattered or backscattered charged particle beam passed through the objective lens.

16. The charged particle beam device according to claim 10, further comprising a booster for accelerating the primary charged particles after being generated by the charged particle beam source.

17. The charged particle beam device according to claim 16, wherein the booster comprises a cylinder for generating an accelerating field.

18. The charged particle beam device according to claim 16, further comprising a retarder for decelerating the primary charged particles prior to impinging onto the specimen.

19. The charged particle beam device according to claim 18, wherein the retarder comprises two electrodes for generating a retarding field.

20. A method for inspecting a specimen comprising the steps of:
    dividing a beam of secondary, scattered or backscattered charged particles into a beam of high energy particles and a beam of low energy particles;
    detecting particles of the beam of high energy particles at a front detector;
    detecting particles of the beam of low energy particles at a reverse detector; and
    changing the direction of secondary, scattered or backscattered charged particle beam with respect to the primary charged particle beam propagation direction by means of a bending sector;
    wherein changing the direction of the secondary, scattered or backscattered charged particles is undertaken upstream of the reverse detector with respect to the secondary, scattered or backscattered charged particle beam, and wherein changing the direction of the secondary, scattered and/or backscattered charged particles is undertaken off-axis of the beam of primary charged particles;
    wherein dividing is carried out at a position between the front detector and the reverse detector; and
    wherein detecting the high energy particles or detecting the low energy particles comprises angle sensitive detection.

21. The method for inspecting a specimen according to claim 20, further comprising the step of directing a primary charged particle beam onto a specimen, thereby generating the beam of secondary, scattered or backscattered charged particles.

22. The method for inspecting a specimen according to claim 20, wherein the dividing of the beam of the secondary, scattered or backscattered charged particles is done by the use of an electrostatic field.

23. The method for inspecting a specimen according to claim 20, wherein a traveling direction of the low energy particle beam is substantially opposite to a traveling direction of the high energy particle beam.

24. The method for inspecting a specimen according to claim 20, further comprising the step of separating the primary charged particle beam and the secondary, scattered or backscattered charged particle beam.

25. The method for inspecting a specimen according to claim 20, further comprising the step of jointly evaluating the signals obtained by detecting the high energy particles and the low energy particles.

26. The method for inspecting a specimen according to claim 25, wherein the step of jointly evaluating the signals comprises adding or subtracting the signals.

27. The method for inspecting a specimen according to claim 20, further comprising focusing the beam of secondary, scattered or backscattered charged particles such that a focus is provided in the divider.

* * * * *